US 6,722,027 B2

(12) United States Patent  (10) Patent No.: US 6,722,027 B2
Peckham et al.  (45) Date of Patent: Apr. 20, 2004

(54) METHOD OF POSITIONING OF SELF-ADJUSTING PRINTED CIRCUIT BOARD SUPPORT

(75) Inventors: Mark V. Peckham, Boise, ID (US); Tony Teitenberg, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 09/777,885

(22) Filed: Feb. 7, 2001

(65) Prior Publication Data

US 2001/0003866 A1 Jun. 21, 2001

Related U.S. Application Data

(62) Division of application No. 09/387,774, filed on Sep. 1, 1999, now Pat. No. 6,412,768.

(51) Int. Cl.[7] .................... H05K 3/30
(52) U.S. Cl. ............ 29/832; 29/729; 29/759; 29/760; 29/829; 29/834; 198/369.1; 198/586; 269/3; 269/203; 269/254; 269/289
(58) Field of Search ................. 29/729, 759, 760, 29/829, 830, 832, 834; 269/3, 203, 254, 289; 198/309.1, 586

(56) References Cited

U.S. PATENT DOCUMENTS

| 3,826,483 A | 7/1974 | Siegel |
| 3,838,777 A | 10/1974 | Thornicroft |
| 3,853,379 A | 12/1974 | Goodman |
| 3,930,644 A | 1/1976 | Albert, Jr. |
| 4,030,717 A | 6/1977 | Serlovsky |
| 4,184,599 A | 1/1980 | Drake |
| 4,667,868 A | 5/1987 | Decker |
| 4,672,735 A | 6/1987 | Tamano |
| 5,067,648 A | 11/1991 | Cascini |
| 5,694,843 A | 12/1997 | Chen |
| 5,775,568 A | 7/1998 | Asia et al. |
| 5,820,013 A | 10/1998 | Oritz |
| 5,899,446 A * | 5/1999 | Thompson .............. 269/55 |
| 5,922,230 A | 7/1999 | Yokota |
| 6,148,511 A * | 11/2000 | Taguchi ............... 29/834 |
| 6,161,277 A * | 12/2000 | Asai et al. ............ 27/740 |
| 6,327,776 B1 * | 12/2001 | Suhara .................. 29/832 |
| 6,481,099 B1 * | 11/2002 | McWilliams ........... 29/832 |

FOREIGN PATENT DOCUMENTS

| JP | 03120789 | 5/1991 | |
| JP | 05345496 | 12/1993 | |
| JP | 06164197 A * | 6/1994 | .......... H05K/13/04 |

* cited by examiner

Primary Examiner—Peter Vo
Assistant Examiner—Paul D Kim
(74) Attorney, Agent, or Firm—Dickstein Shapiro Morin & Oshinsky LLP

(57) ABSTRACT

A printed circuit board support including a first member having a planar upper surface for supporting a printed circuit board. At least one second member is movably coupled to a first side of the first member and movable toward and away from the side of the movable member, and a bias source biases the second member in a direction away from the first member. The support is readily compressed to allow placement into or onto a space defined by surfaces of a positioning device, and the support expands upon its release to fill the space. When the support is left in the positioning device during a change over to a different circuit board, the support will automatically adjust to any width-wise adjustment in the space between the surfaces of the positioning device.

5 Claims, 3 Drawing Sheets

METHOD OF POSITIONING OF SELF-ADJUSTING PRINTED CIRCUIT BOARD SUPPORT

This application is a divisional application of U.S. patent application Ser. No. 09/387,774 filed Sep. 1, 1999 U.S. Pat. No. 6,412,768, the entirety of which is incorporated herein by reference.

BACKGROUND OF THE INVENTION

1. Field of the Invention

The present invention relates to a self-adjusting printed circuit board support for use at a printed circuit board screen printing station. More particularly, the present invention relates to a self-adjusting printed circuit board support for use at a screen printer station in a printed circuit board assembly line.

2. Description of Related Art

A common step used during the assembly of active and passive devices onto a printed circuit board is a screen printer station. Typically at this station the circuit is already on the printed circuit board and solder is squeegeed through a screen or template onto the circuit in preparation for subsequent stations where active and passive components are placed on the board. In addition, a screen printer may be used as well to place the circuit pattern on the printed circuit board. Prior art tooling or supports used for holding the printed circuit board in the screen printer station are generally designed for the narrowest printed circuit board, thus leaving large areas of larger printed circuit boards unsupported. Other known support devices require the use of multiple fixed supports which are each designed for a specific width of the various sized printed circuit boards to be assembled.

SUMMARY OF THE INVENTION

A universal printed circuit board support which can fully support various sizes of printed circuit board in a screen printer and in the fabrication and/or assembly environments is desirable, and is provided by the present invention.

In one aspect on the invention a printed circuit board support comprises a first member having a planar upper surface for supporting a printed circuit board. At least one second member is movably coupled to a first side of the first member and movable toward and away from the side of the movable member; and a bias source biases the second member in a direction away from the first member.

In another aspect, the present invention provides a printed circuit board support for use at a printed circuit board assembly station which is width-wise adjustable to support printed circuit boards of various width-wise dimensions.

The support comprises a pair of parallel outer rails, each of which has outer surfaces for abutting engagement with one of a pair of spaced surfaces on a positioning device at the assembly station. A pair of parallel inner rails are provided between and spaced from the pair of outer rails, and a mid-block is provided between and spaced from the pair of inner rails. The mid-block and inner and outer rails have upper surfaces for supporting the printed circuit board at the assembly station. A first plurality of rods, each of which is fixed at one end thereof to the first one of the outer rails, extend through a first respective plurality of transverse holes in a first one of the inner rails. A second plurality of rods, each fixed at one end thereof to a second one of the outer rails, extend through a second respective plurality of transverse holes in a second one of the inner rails. A plurality of components for biasing each one of the outer rails and the inner rails outwardly from the mid-block are associated with the rods. The outer rails are moveable toward each other against the bias of the plurality of biasing components by compressive forces applied against the outer rails to fit the outer rails in abutting engagement with the spaced surfaces on the positioning device.

The self adjusting printed circuit board support of the present invention provides maximum support for a wide variety of sizes of printed circuit boards used, for example, in the production of memory modules. When used in a typical screen printer the self-adjusting printed circuit board support of the present invention supports in its length-wise direction the entire length of a printed circuit board. When compressed width-wise, it self adjusts to support the entire width of the printed circuit board.

The support of the present invention is readily compressed by hand to allow placement into or onto a positioning device between a space defined by surfaces of the positioning device and the support expands upon its release to fill the space. When the support is left in the assembly station during a change over to a different width circuit board, the support will automatically adjust to the width fixed by any width-wise adjustment in the space between the surfaces of the positioning device.

The above and other features and advantages of the invention will be more readily understood from the following detailed description which is provided in conjunction with the accompanying drawings.

DETAILED DESCRIPTION OF THE INVENTION

Figure 1:
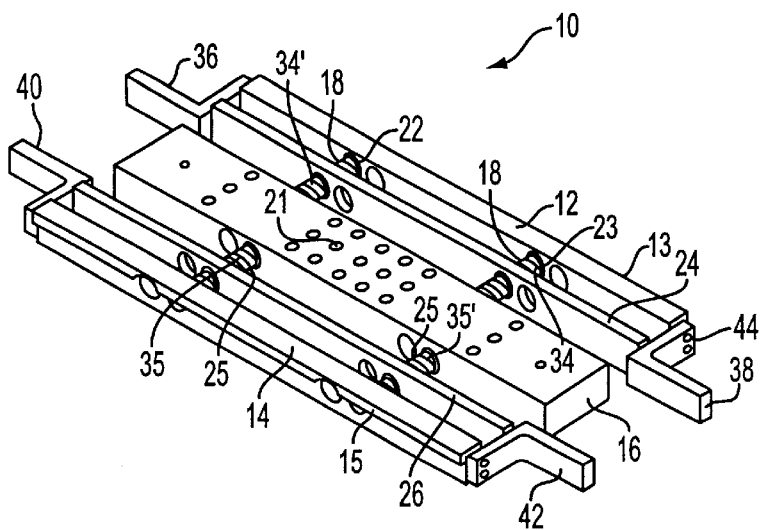
FIG. 1 is a perspective view of a self-adjusting printed circuit board support for use at a printed circuit board assembly station in accordance with the present invention.
Figure 2:
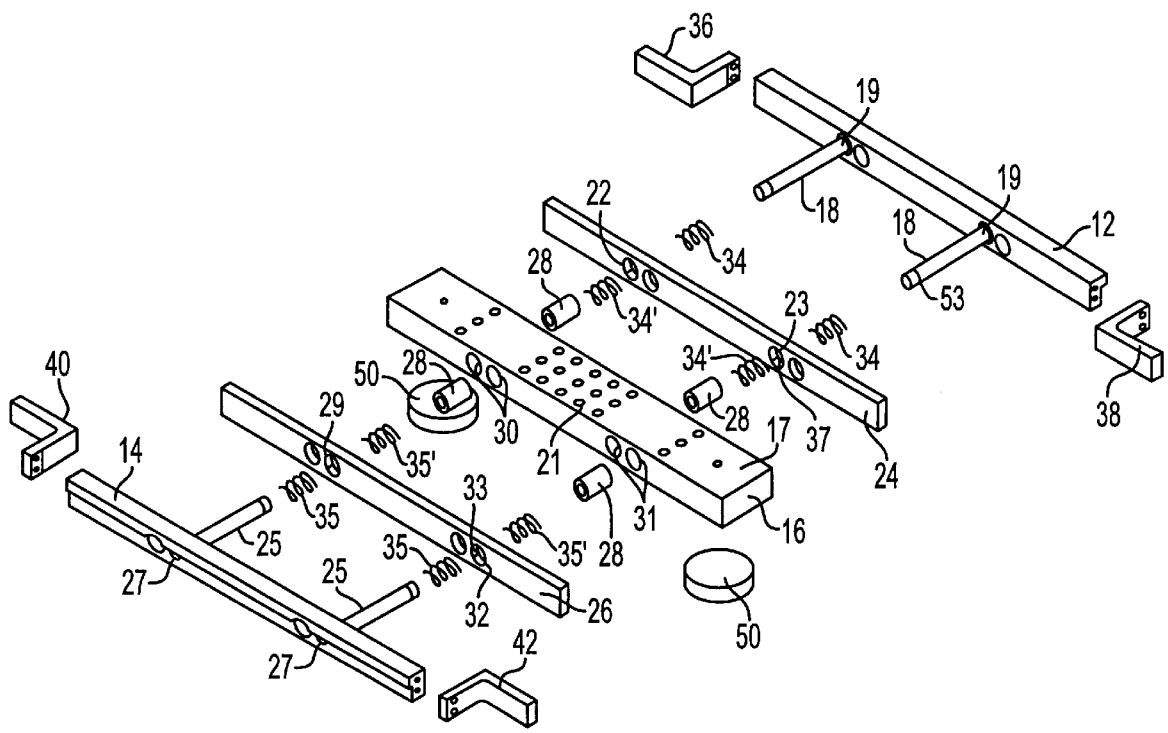
FIG. 2 is an exploded view of the support of FIG. 1.

With reference to FIGS. 1–4, there is shown an embodiment of a self-adjusting printed circuit board support 10 in accordance with the present invention. The support 10 has a pair of parallel outer rails 12,14 each of which has an outwardly extending lip 13,15 for abutting engagement with a plurality of spaced surfaces 90–95 (FIG. 8) on a positioning device 97 (FIGS. 7 & 8) at an assembly station. A pair of parallel inner rails 24,26 are located between and spaced from the pair of outer rails 12,14. The support 10 also includes a mid-block 16 which is located between and spaced from the pair of inner rails 24,26. The mid-block 16 has an upper surface 17 for supporting a printed circuit board at the assembly station. Likewise, the inner 24, 26 and outer 12, 14 rails have an upper surface, co-planar with the upper surface of mid-block 16, for supporting the printed circuit board.

Figure 5:
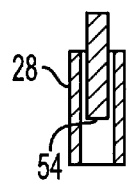
FIG. 5 is a cross-sectional view taken along line V—V of FIG. 3.

A pair of rods 18, each fixed at one end thereof 19 to a first one 12 of the outer rails 12,14, extend through a first plurality of transverse holes 22,23 in a first one 24 of the inner rails 24,26. A second pair of rods 25, each fixed at one end 27 thereof to a second one 14 of the outer rails 12,14, extend through a second pair of transverse holes 29,32 in a second one 26 of the inner rails 24,26. The first and second pair of rods 18,25 extend through respective holes 30,31 in the mid-block 16. Each hole 30,31 in the mid-block 16 has therein a linear ball bearing assembly 28 (FIG. 5) for supporting a respective one of the rods 18,25.

Each one of the transverse holes 22,23;29,32 in the two inner rails 24,26 has a counter-sunk portion 33,37 on each side for seating a coil compression spring 34,34';35,35' therein. Each one of the rods 18,25 has a circumferential recess 53 at each end thereof. The recess 53 receives an E-clip 54 (FIG. 5) therein after the rods 18,25 are passed through respective springs 34,34';35,35', respective inner rails 24,26, respective springs 34,34';35,35' and the inner-block 16. Each E-clip 54 abuts an underside of a respective linear ball bearing assembly 28 (FIG. 5) to prevent the its respective rod from passing through the linear ball bearing assembly 28 under the bias of the springs 34,34';35,35'. However as shown in FIG. 3, the E-clips 54 have an outer dimension which is smaller than holes 60,61;62,63 in the inner rails 24,26 and holes 64,65;66,67 in the outer rails to permit the rods 18,25 to pass through the inner rails 24,26 and into the outer rails 12,14 when the support 10 is in a compressed state as shown in FIG. 6.

The coiled compression springs 34,35 function to bias each one of the outer rails 12,14 and inner rails 24,26 outwardly from the mid-block 16. The outer rails 12,14 are moveable toward each other against the bias of the coiled compression springs 34,34';35,35' to position the support 10 between spaced surfaces on the positioning device 97 of a screen printer, and upon release the support expands to provide contact between the outer surfaces 13,15 on the outer rails 12,14 with the spaced surfaces on the positioning device 97.

The printed circuit board support of the present invention is particularly suitable for use at a screen printer assembly station.

Figure 3:
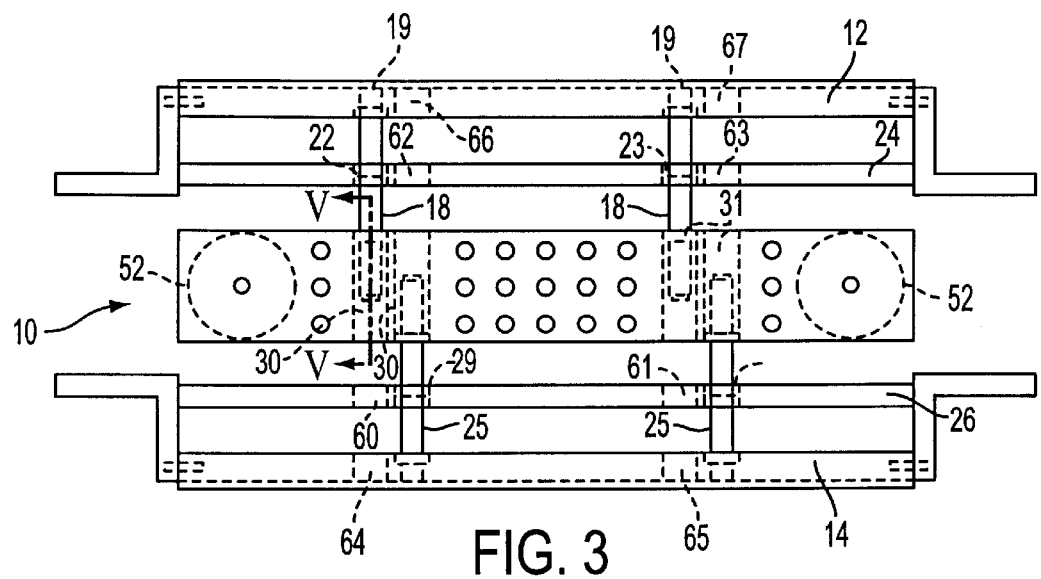
FIG. 3 is a top plan view of the support of FIG. 1.
Figure 4:
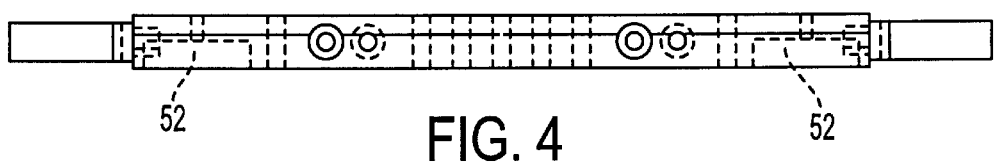
FIG. 4 is a side elevational view of the support of FIG. 3.
Figure 6:
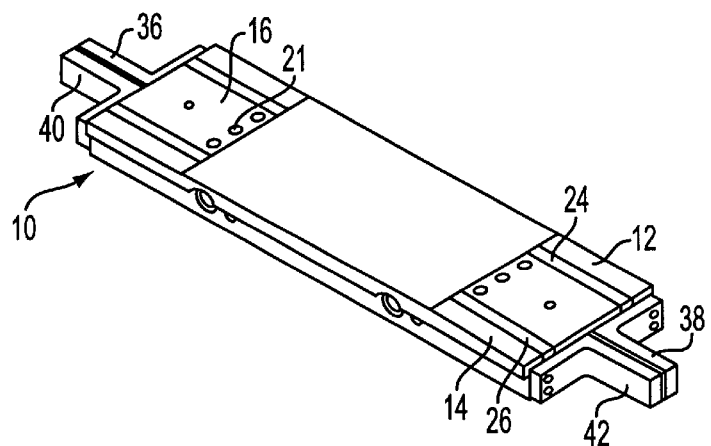
FIG. 6 is a perspective view of the support of FIG. 1 in a fully compressed state and with a printed circuit board thereon.

The printed circuit board support functions such that the outer rails 12,14 are moveable between a fully open position as shown in FIGS. 1 and 3 when no compressive forces are applied thereto, and a fully compressed position when force is applied to compress the support as shown in FIG. 6 wherein the outer rails 12,14 are in contact with the inner rails 24,26 and the inner rails are in contact with the mid-block 16.

When no compressive forces are applied to the outer rails 12,14, the rods 18 extending from the outer rail 12 and the rods 25 extending from the other outer rail 14 extend through respective inner rails 24,26 and into linear ball-bearing assemblies 28 in the transverse holes 30,31 through the mid-block 16 as shown in FIG. 3. When the printed circuit board support is fully compressed as shown in FIG. 6, the rods 18 extending from the first outer rail 12 pass through the transverse holes 30,31 of the mid-block 16, the holes 60,61 in the inner rail 26 and into holes 64,65 of the second outer rail 14. In like manner, the rods 25 connected to the second outer rail pass through a second set of transverse holes 30,31 in the mid-block 16, through holes 62,63 in the first inner rail 24 and into a pair of holes 66,67 in the first outer rail 12.

Figure 7:
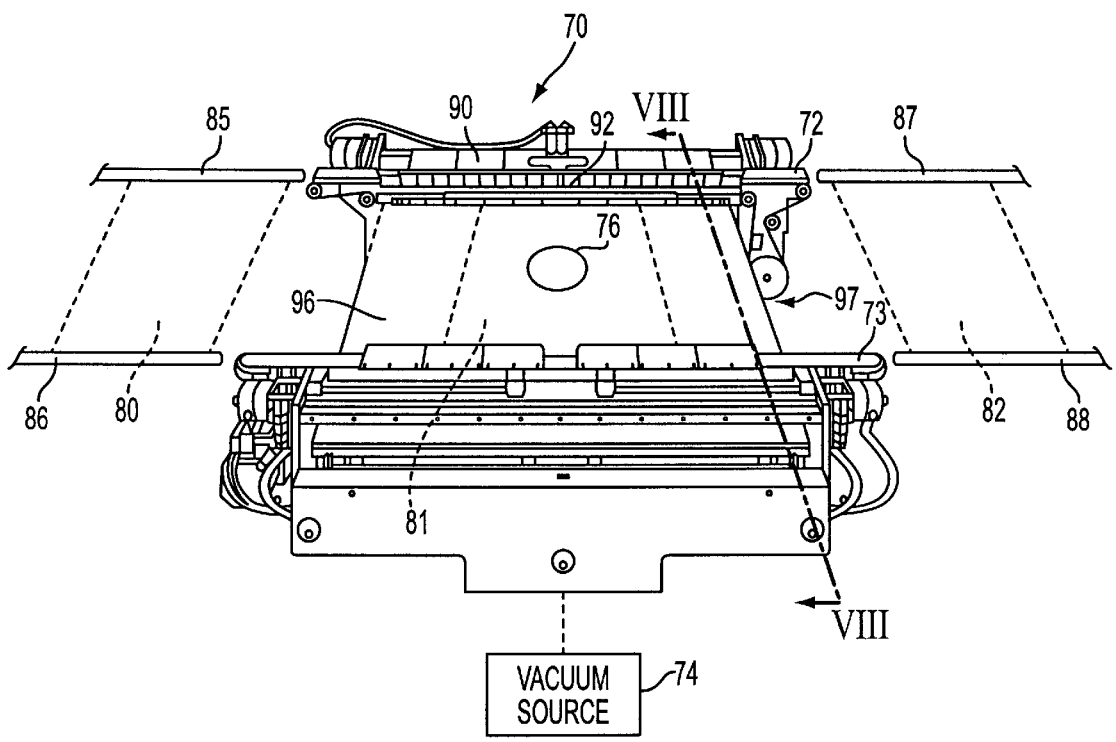
FIG. 7 is a perspective view of a screen printer with its cover removed.

The mid-block 16 is elongated and has a plurality of perforations 21 which extend through the mid-block 16 from the upper support surface 17. When in position in the screen printer 70 as shown in FIG. 7, the support 10 is positioned over a conduit 76 which is in communication with a vacuum source 74. The pull of the vacuum generated by the source 74 through the port 76 and the perforations 21 act to draw the printed circuit board against the upper support surface 17, and thus hold the printed circuit board in position during the screen printer operation.

The outer rails 12,14 each have a pair of support handles 36,38; 40,42 secured respectively thereto by rivets or screws 44. The support handles 36,38; 40,42 are manually engageable for applying compressive forces to the printed circuit board support 10 during installation in the positioning device 97 of the screen printer station.

Figure 8:
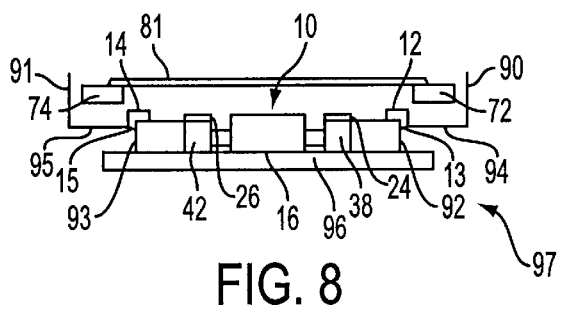
FIG. 8 is a cross-sectional view taken along line VIII—VIII of FIG. 7.

A portion of a screen printer station 70 is shown in FIGS. 7 and 8 with a cover (not shown) removed. The positioning device 97 includes opposing step-like spaced surfaces 90,92, 94;91,93,95 formed from sheet metal. Each one of the shaped surfaces has a leg 92,93 connected to and extending upwardly from a steel plate 96, and an upwardly extending portion 90,91 spaced outwardly by horizontal portion 94,95. Internal conveyor belts 72,73 are spaced above horizontal portions 94,95, respectively.

As shown in FIG. 8, the lips 13,15 of the outer rails 12,14 are in abutting engagement with the step-like spaced surfaces 92;93 when the support 10 is released.

With reference to FIGS. 7 and 8, the support 10 is positioned on the steel plate 96 and is held thereon by magnets 50 which are positioned in recesses 52 located in the underside of the mid-block 16.

Printed circuit boards 80,81,82 are sequentially supplied to the screenprinter 70 by a pair of feeder conveyor belts 85,86. Each printed circuit board is transferred from the conveyor belts 85,86 to the internal conveyor belts 72,73 of the screenprinter 70. The conveying system is indexed such that each printed circuit board stops in the position shown in FIG. 7. The positioning device 97 including the steel plate 96 and the sheet metal opposing step-like spaced surfaces 90,92,94;91,93,95 are raised to lift the support 10 upwardly between the internal conveyor belts 72,73 to contact the underside of the printed circuit board 81. The printed circuit board 81 is drawn to the support 10 by the vacuum applied through port 76, to the underside of the support 10, and through the perforations 21 in the mid-block 16. The vacuum acts to retain the printed circuit board 81 against the upper support surface 17 of the mid-block 16, and the upper surfaces of the inner 24, 26 and outer 12, 14 rails, with the printed circuit board overhanging the sides of the support 10 by a very slight distance. The printed circuit board 81 is lifted off the internal conveyor belts 72,73 at which position the screenprinting step is carried out. After screenprinting, the support 10 is lowered by the screenprinter positioning device 97 to return the printed circuit board 81 to the internal conveyor belts 72,73. The internal conveyor belts 72,73 in turn passes the printed circuit board 81 to exit conveyor belts 87,88 that are external to the screenprinter 70 while another printed circuit board is fed by the feeder conveyor belts 85,86 to the screenprinter 70.

Figure 9:
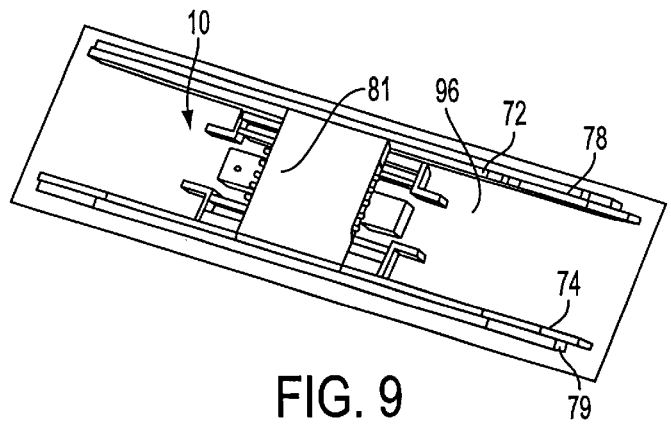
FIG. 9 is a top plan view of the screen printer showing a self-adjusting printed circuit board support installed therein and supporting a printed circuit board.

In an alternative embodiment, a pair of snugger bars 78,79 (FIG. 9) engage the side surfaces of the printed circuit board 81 while in the screenprinter 70 and after the board 81 and support 10 are lifted by the positioning device 97. In this embodiment, both the vacuum 74 and the snugger bars 78,79 hold the printed circuit board in a fixed position during the screenprinting operation. After the printing operation, the snugger bars 78,79 are retracted, and the support is lowered by the positioning device 97 to place the printer circuit board 81 back on the internal conveyor belts 72,73 for passage to the external conveyor belts 87,88.

Thus, the present invention provides a universal printed circuit board support which can fully support various sizes of printed circuit board in a screenprinter and/or in other fabrication and assembly environments.

Although the present invention has been described with preferred embodiments, it is to be understood that modifications and variations may be utilized without departing from the spirit and scope of this invention, as those skilled in the art will readily understand. Such modifications and variations are considered to be part of the invention, provided they come within the scope of the appended claims and their equivalents.

What is claimed is:

1. A method of positioning a printed circuit board at an assembly station with a support comprising:

providing a pair of parallel outer rails; a pair of parallel inner rails between and spaced from said pair of outer rails; a mid-element between and spaced from said pair of inner rails, said mid-element and inner and outer rails having upper surfaces for supporting at least one printed circuit board at said assembly station; and a plurality of components for biasing each one of said outer rails and said inner rails outwardly from said mid-element, said outer rails being movable toward each other against the bias of said plurality of biasing components by compression forces applied against said outer rails to fit said outer rails between and in abutting engagement with a pair of spaced surfaces on a positioning device;

placing said outer rails in abutting engagement with said spaced surfaces by compressing said outer rails and releasing said outer rails when said outer rails are between said spaced surfaces;

sequentially supplying printed circuit boards to said assembly station by a pair of feeder conveyor belts;

transferring said printed circuit boards from said feeder conveyor belts to a pair of assembly station internal conveyor belts;

raising said positioning device to lift said support upwardly between said internal conveyor belts to contact said printed circuit board;

drawing said printed circuit board to said support by a vacuum applied through said support, and through at least one perforation in said mid-element;

lifting said printed circuit board off said internal conveyor belts;

performing a printed circuit board assembly step;

lowering said support to return said printed circuit board to said internal conveyor belts; and passing said printed circuit board to a pair of exit conveyor belts while another printed circuit board is fed by said feeder conveyor belts to said assembly station.

2. The method of claim 1 wherein said support will automatically adjust to a width fixed by any width-wise adjustment in a space between said spaced surfaces of the positioning device.

3. The method of claim 1 wherein a first plurality of rods each fixed at one end thereof to a first one of said outer rails and extending through a first plurality of transverse holes in a first one of said inner rails;

a second plurality of rods each fixed at one end thereof to a second one of said outer rails and extending through a second plurality of transverse holes in a second one of said inner rails.

4. The method of claim 1 wherein the transfer of said printed circuit boards are indexed such that only one printed circuit board is on said internal conveyor belts during said printed circuit board assembly step.

5. The method of claim 1 wherein said support is positioned on a metal plate and is held thereon by at least one magnet.

* * * * *